(12) United States Patent  (10) Patent No.: US 8,168,468 B2
Mathew et al.  (45) Date of Patent: May 1, 2012

(54) METHOD OF MAKING A SEMICONDUCTOR DEVICE INCLUDING A BRIDGEABLE MATERIAL

(75) Inventors: Varughese Mathew, Austin, TX (US);
Sam S. Garcia, Austin, TX (US);
Tushar P. Merchant, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 797 days.

(21) Appl. No.: 12/039,909

(22) Filed: Feb. 29, 2008

(65) Prior Publication Data

US 2009/0218567 A1  Sep. 3, 2009

(51) Int. Cl.
*H01L 21/00* (2006.01)
(52) U.S. Cl. .................. 438/95; 257/E31.029
(58) Field of Classification Search ............ 438/95
See application file for complete search history.

(56) References Cited

U.S. PATENT DOCUMENTS

| 5,914,893 | A | 6/1999 | Kozicki et al. | |
| 6,020,266 | A * | 2/2000 | Hussein et al. | 438/694 |
| 6,084,796 | A | 7/2000 | Kozicki et al. | |
| 7,030,410 | B2 | 4/2006 | Moore | |
| 7,109,056 | B2 | 9/2006 | Klein | |
| 2002/0127886 | A1* | 9/2002 | Moore et al. | 438/800 |
| 2002/0190289 | A1* | 12/2002 | Harshfield et al. | 257/295 |

* cited by examiner

*Primary Examiner* — Marcos D. Pizarro
*Assistant Examiner* — Eva Yan Montalvo (57) ABSTRACT

A method for making a semiconductor device (10) includes providing an interconnect layer (14) over an underlying layer (12), forming a first insulating layer (16) over the interconnect layer, and forming an opening (18) through the insulating layer to the interconnect layer. A first conductive layer (24) is formed over the interconnect layer and in the opening. This is performed by plating so it is selective. A second conductive layer (28) in the opening is formed by displacement by immersion. This is performed after the first conductive layer has been formed. The result is the second conductive layer is formed by a selective deposition and is effective for providing it with bridging material. A layer of bridgeable material (34) is formed over the second conductive layer and in the opening. A third conductive layer (42) is formed over the bridgeable material. The semiconductor device may be useable as a conductive bridge memory device.

20 Claims, 8 Drawing Sheets

METHOD OF MAKING A SEMICONDUCTOR DEVICE INCLUDING A BRIDGEABLE MATERIAL

BACKGROUND

1. Field

This disclosure relates generally to semiconductor memory devices, and more specifically, to conductive bridge random access memory devices and methods of making the same.

2. Related Art

Programmable metallization memories, also referred to as conductive bridge random access memory (CBRAM) cells, generally consist of a chalcogenide material/silver diffusion layer that is sandwiched between a bottom electrode (e.g. W) and an upper electrode (Ag or Cu). Memory cell operation is believed to be due to formation/dissolution of a conductive bridge formed by electro-deposition of silver. It is important to have diffusion of silver ions to chalcogenide occur in a controllable manner. However, in the current known fabrication method for CBRAM cells, silver is deposited by a physical vapor deposition (PVD) process. In such a method, silver diffuses rapidly into the chalcogenide during the PVD step itself and thus the silver diffusion is largely uncontrolled. This results in significant variability in the memory cell operation from one cell to another. In addition, removal of sputter deposited silver from unwanted areas is also a difficult process.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

According to one embodiment of the method of the present disclosure, conductive bridge random access memory (CBRAM) devices are formed with use of selective deposition of silver (Ag) in contrast to sputter deposition. In one embodiment, the Ag is deposited by a selective displacement process. In addition, the method includes the formation of a selectively deposited diffusion control layer on the silver. In one embodiment, the diffusion control layer comprises, for example, cobalt (Co), tungsten (W), rhenium, or Molybdenum, and an additional element X (CoWX), where X includes one or more of boron (B), and phosphorus (P). Furthermore, the method of the present disclosure advantageously uses a barrier layer of CoWX for controlling diffusion of Ag within the CBRAM. The barrier layer of CoWX also possesses a thickness dependent barrier property, in which a desired barrier property can be controlled via the barrier layer thickness according to the requirements of a given CBRAM application. The barrier layer can also be selectively deposited on Ag or copper (Cu). Still further, the CBRAM structure as disclosed herein is novel and compatible with a selective deposition process.

The embodiments of the present disclosure advantageously provide a method that allows formation of CBRAM devices with less process steps and more controllable integration. Such a method or fabrication process can be used for semiconductor devices of 45 nm nodes and beyond.

Figure 1:
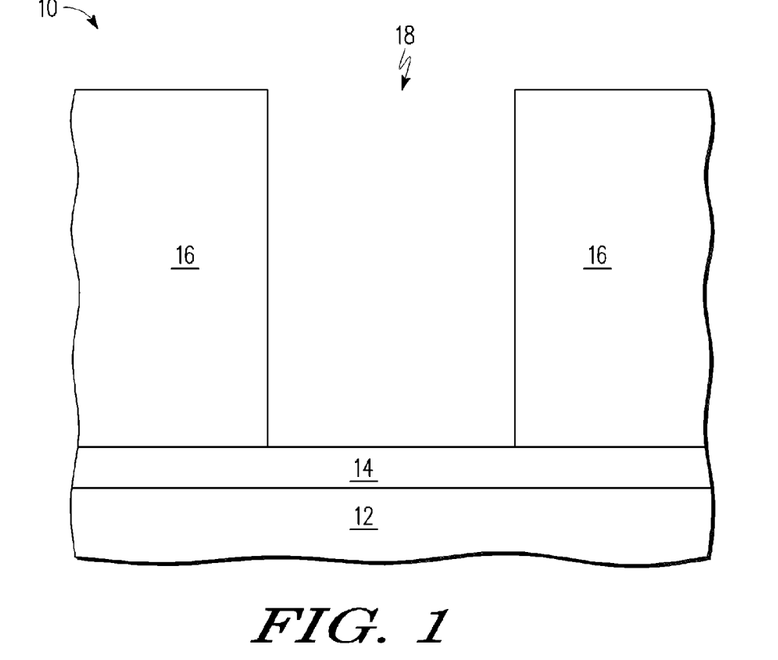
FIGS. 1-10 are cross-sectional views of a portion of a conductive bridge random access memory (CBRAM) bitcell, also referred to as a programmable metallization cell (PMC), at various stages of a method for making the same, according to one embodiment of the present disclosure.

FIGS. 1-10 are cross-sectional views of a portion of a conductive bridge random access memory (CBRAM) bitcell, also referred to as a programmable metallization cell (PMC), at various stages of a method for making the same, according to one embodiment of the present disclosure. Referring now to FIG. 1, the method of forming a CBRAM bitcell 10 begins with providing a starting layer structure 12, an interconnect metal layer 14, an interlevel dielectric 16, and an opening 18 formed within the interlevel dielectric 16 at a desired location of a CBRAM bitcell device, all formed using any suitable semiconductor processing techniques. The starting layer structure 12 can comprise, for example, any semiconductor layer structure, including for example, active semiconductor devices and/or circuits formed within and/or overlying a semiconductor substrate, further as determined according to the requirements of a given semiconductor device application utilizing the CBRAM bitcell device. Interconnect metal layer 14 and interlevel dielectric layer 16 comprise any suitable metal layer or interlevel dielectric layer, respectively, selected according to the requirements of a given semiconductor device application utilizing the CBRAM bitcell device. In one embodiment, interconnect metal layer 14 can comprise W, Cu, Al, or other suitable metal and ILD 16 can comprise silicon dioxide, SiCOH, or other suitable interlevel dielectric.

Figure 2:
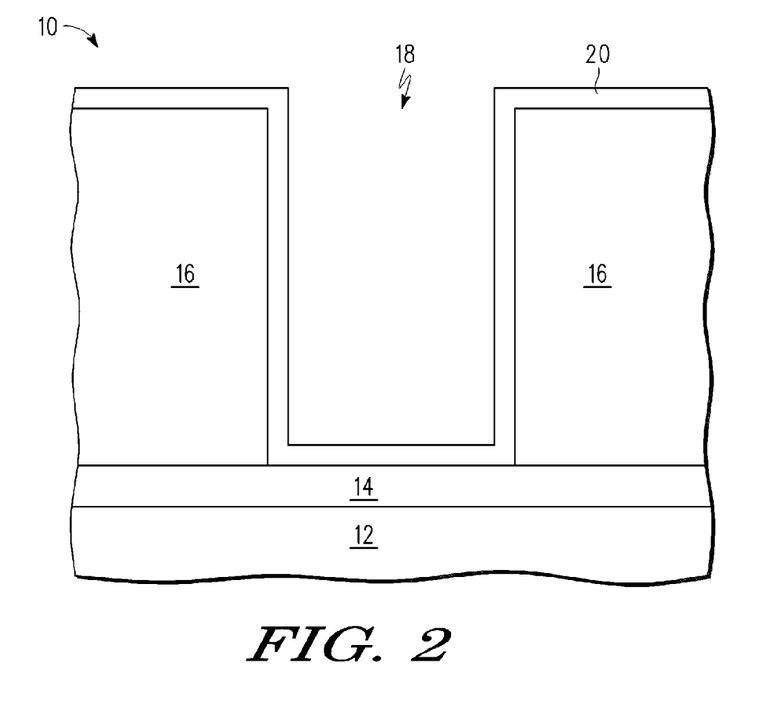
Figure 3:
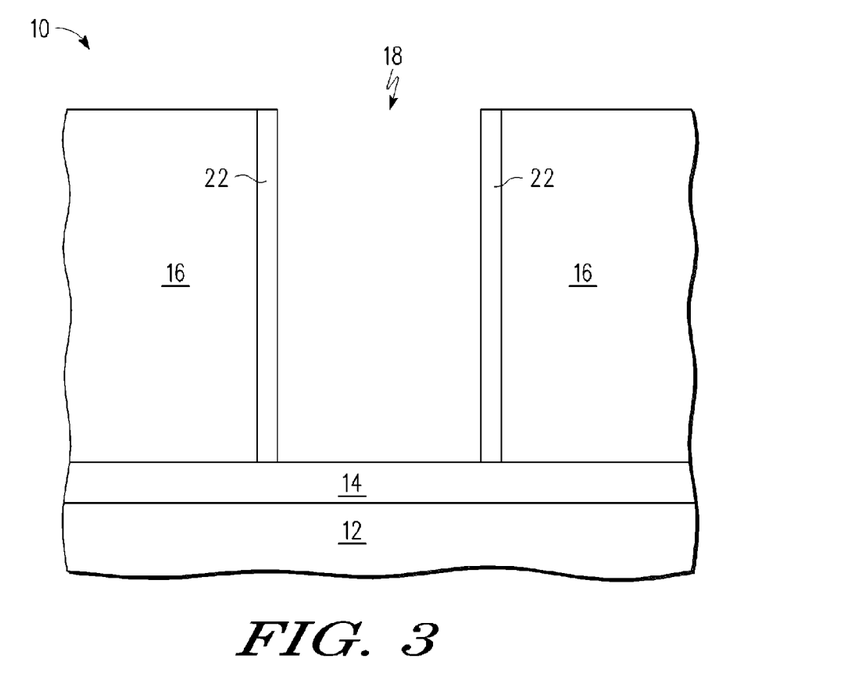

In FIG. 2, an insulating layer 20 of non-conductive barrier material is deposited overlying the CBRAM bitcell structure 10 via suitable deposition techniques, the non-conductive barrier material having a thickness sufficient to prevent out-diffusion of electrode metal (yet to be formed) into the ILD 16. In one embodiment, the non-conductive barrier material can comprise plasma enhanced nitride (PEN) having a thickness on the order of 250 angstroms. In FIG. 3, an anisotropic etch is carried out for removing layer 20 from a top surface of ILD 16 and for exposing the bottom metal layer 14 within opening 18. The anisotropic etch further aids in the formation of sidewall spacer 22 along inner sidewall edges of opening 18. In one embodiment, the anisotropic etch comprises an anisotropic PEN etch.

Figure 4:
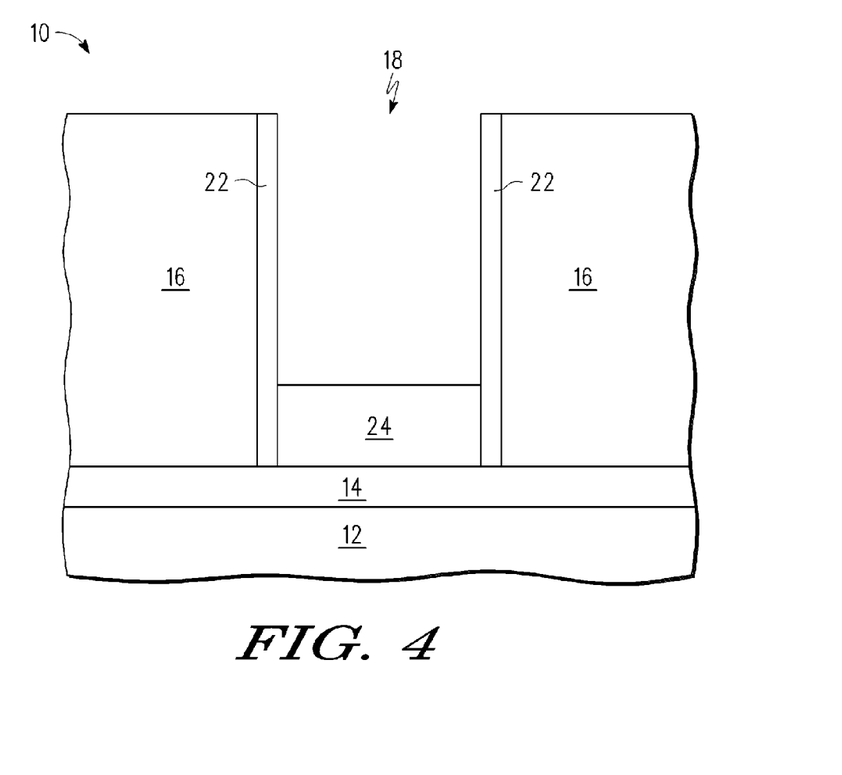

In FIG. 4, metal 24 is formed within opening 18 and sidewall spacer 22. Metal 24 comprises at least a portion of an active electrode. In one embodiment, metal 24 comprises copper, and more particularly, an electroless plated copper having a thickness on the order of 500 angstroms or less. In the latter instance, the exposed interconnect metal 14 within opening 18 acts as a seed layer, wherein the copper 24 deposits itself on the seed layer of exposed metal alone. In one embodiment, a barrier layer (not shown) such as CoWB could be deposited by electroless plating over the exposed interconnect metal 14 in opening 18 before deposition of the copper layer 24.

Figure 5:
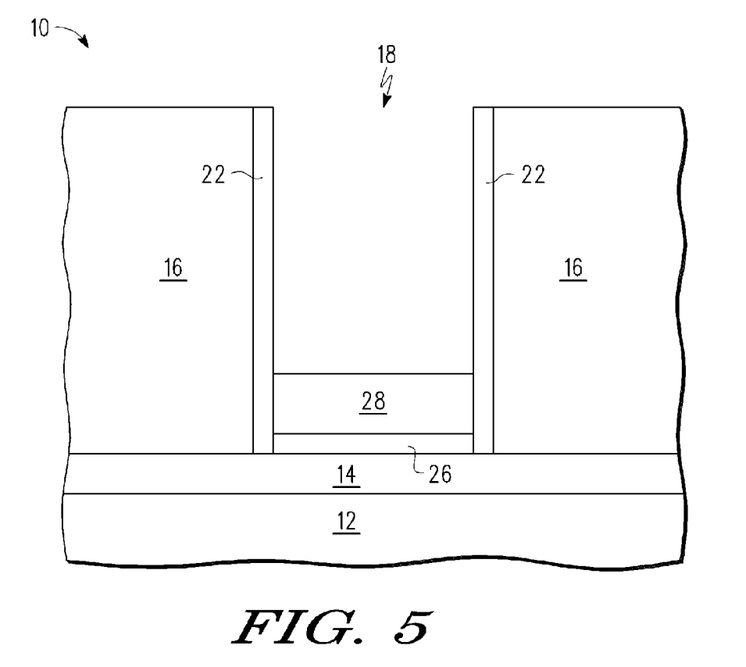

In FIG. 5, the structure 10 is further processed with a silver (Ag) immersion plating which occurs by copper (Cu) displacement. In the Ag immersion plating, an overlying Ag displaces copper of the copper layer 24, which produces a resulting layer 28 of Ag overlying a remainder portion 26 of the copper layer. The Ag displacement layer has a thickness on the order of between 250-375 angstroms. The total thickness of layers 26 and 28 remains approximately the same thickness as the initial thickness of copper layer 24 prior to the step of Ag immersion and plating Cu displacement. Commercially available silver plating baths, for example, from UYEMURA of Ontario, CA, can be used for immersion plating of silver on copper.

Figure 6:
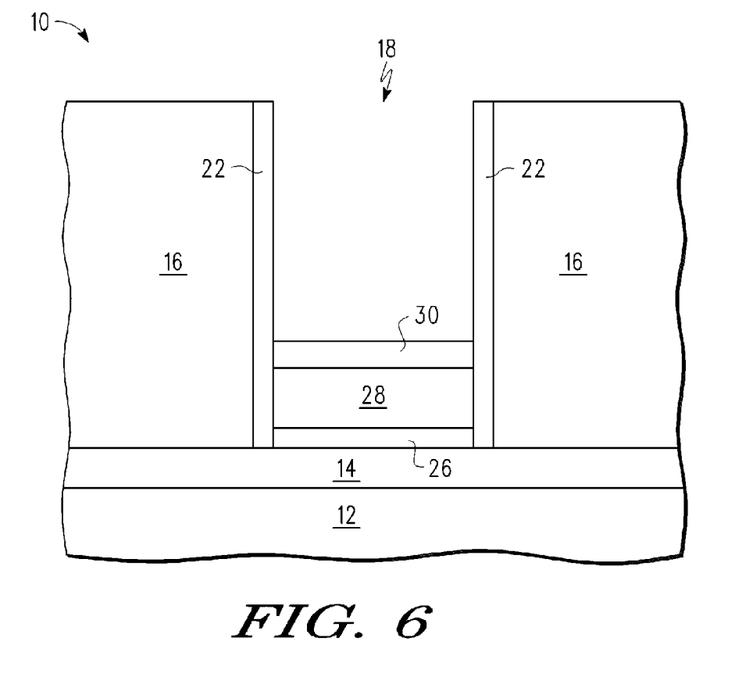

In FIG. 6, a diffusion barrier 30 is formed overlying the Ag displacement layer 28. Formation of the diffusion barrier 30 can comprise, for example, forming the layer via electroless plating. The barrier layer 30 is formed of a given thickness selected for providing a given amount of diffusion barrier property for a given CBRAM semiconductor device implementation. In one embodiment, barrier layer 30 comprises CoWB and is formed via suitable electroless plating techniques known in the art. In other embodiments, the barrier layer 30 can comprise one of group consisting of cobalt and nickel, one of a group consisting of tungsten, molybdenum, and rhenium, and one of a group consisting of boron and phosphorus. For example, in one embodiment, the thickness of the barrier layer can be on the order of 100-1000 angstroms.

Figure 7:
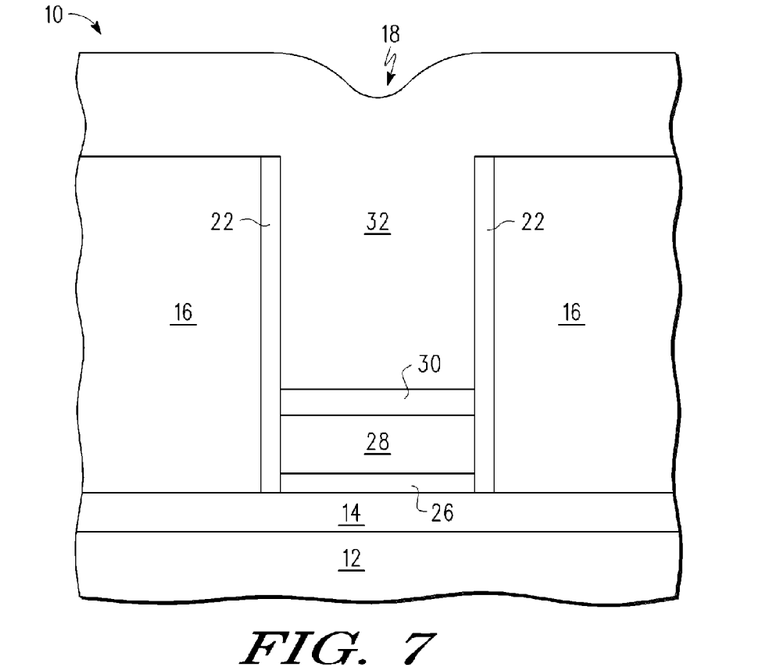

Following formation of the electroless diffusion layer 30, turning now to FIG. 7, a conductive bridgeable material 32 is formed overlying the structure of FIG. 6. In one embodiment, the conductive bridgeable material 32 comprises a chalcogenide, for example, germanium sulfur (GeS), germanium selenium (GeSe), or other suitable chalcogenide material. In one embodiment, the conductive bridge material layer 32 thickness is selected to at least fill a remainder of the opening 18. For example, the thickness of the chalcogenide material 32 is on the order of 500-1000 angstroms.

Figure 8:
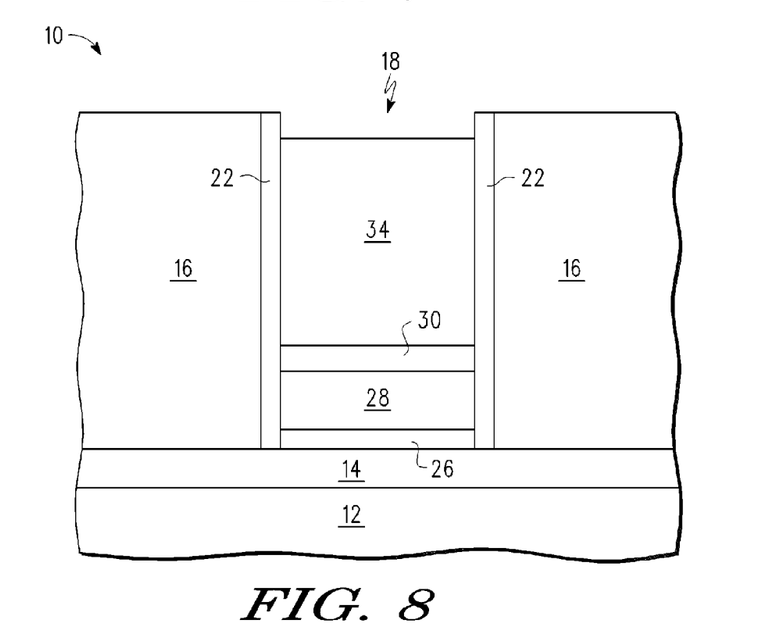

Referring now to FIG. 8, the structure is subjected to a suitable dry etch for etching back the conductive bridgeable material 32. The etching continues until at least recessing the material within opening 18 to form remainder conductive bridgeable material 34. The etching comprises any suitable etch for etching conductive bridgeable material 32. In one embodiment, the dry etch comprises one or more of chlorine ($Cl_2$), hydrogen bromide (HBr), and helium oxide ($HeO_2$).

Figure 9:
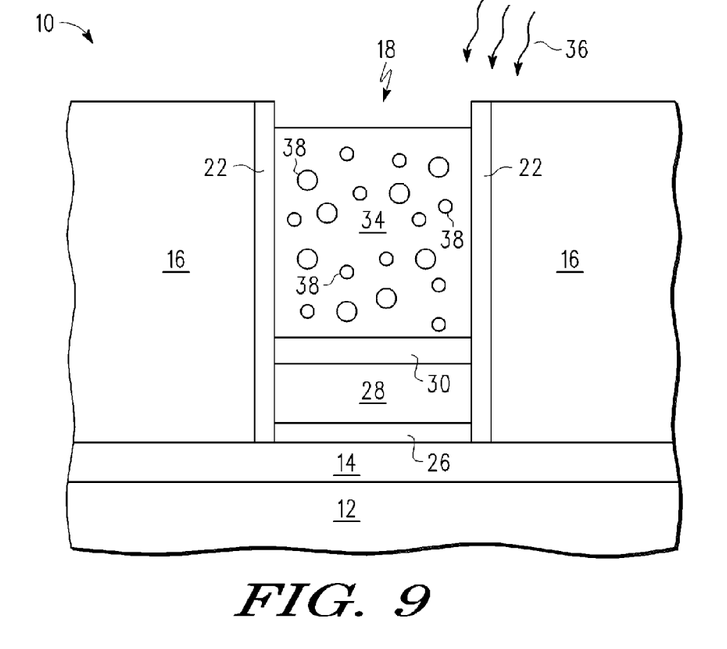

Referring now to FIG. 9, the structure of FIG. 8 is subjected to a treatment 36 for controlled formation of clusters 38 within bridgeable material 34. In one embodiment, the treatment 36 comprises a high temperature anneal sufficient to diffuse controlled amounts of Ag from layer 28 into the bridgeable material 34, wherein the temperature is in the range of 100 to 400 degree Celsius. In another embodiment, the treatment 36 comprises ultra violet (UV) treatment, wherein the structure is exposed to UV radiation sufficient to excite a controlled amount of Ag from layer 28 into the bridgeable material 34 and forming clusters 38. Clusters 38 comprise independent clusters of conductive material having a size on the order of less than 100 angstroms. During operation of the CBRAM, ions from an active electrode, such as an Ag electrode, can migrate within the bridgeable material and form one or more conductive paths between the active electrode and the non-active electrode. The active electrode provides the source of ions that are used in establishing the conductive paths, whereas the non-active electrode does not provide a source of ions for establishing the conductive paths.

Figure 10:
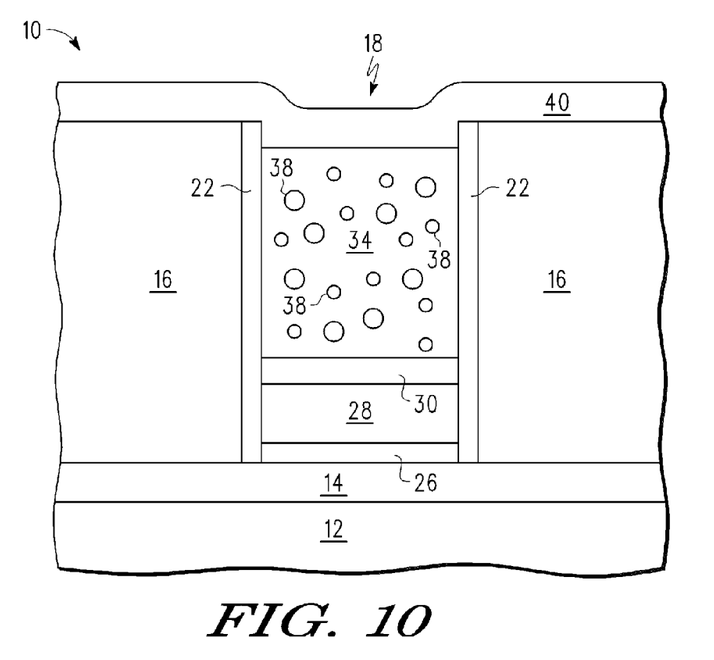

In FIG. 10, a layer of non-active or inert top electrode metal 40 is formed overlying the top surface of the structure of FIG. 9. In one embodiment, the top electrode metal comprises tungsten having a thickness on the order of 250 to 1000 angstroms, wherein the tungsten can be formed by one of chemical vapor deposition (CVD) and/or physical vapor deposition (PVD). The non-active or inert top electrode may further include other non-active metals, excluding Cu).

Figure 11:
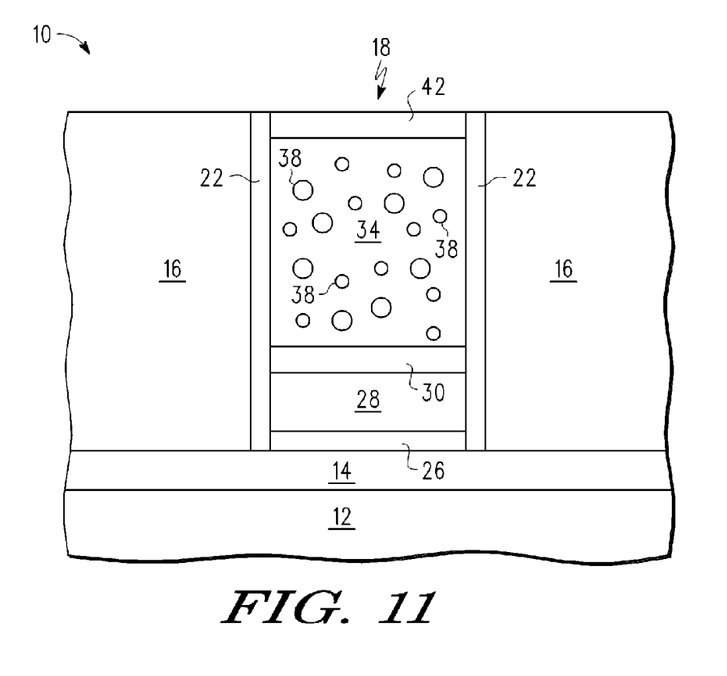
FIG. 11 is a cross-sectional view of a conductive bridge random access memory (CBRAM) bitcell according to one embodiment of the present disclosure.

FIG. 11 is a cross-sectional view of a conductive bridge random access memory (CBRAM) bitcell 10 according to one embodiment of the present disclosure. In particular, the structure of FIG. 10 is planarized, for example, using chemical mechanical planarization techniques known in the art. Planarization of the top electrode metal 40 on bitcell 10 produces a self-aligned inert electrode 42 within opening 18. In addition, layers 26, 28, 30, 34 and 42 are self-aligned by sidewall barriers 22 on the sidewalls within opening 18. The sidewall barrier 22 advantageously provides protection for the CBRAM bitcell 10 during subsequent processing steps, wherein an occurrence of any undesired diffusion leading to degraded device performance or ILD shorting is advantageously minimized or avoided. Further semiconductor device processing can then be carried out as may be desired according to the requirements of a given semiconductor device application which implements one or more embodiments of the CBRAM bitcell device of the present disclosure.

Figure 12:
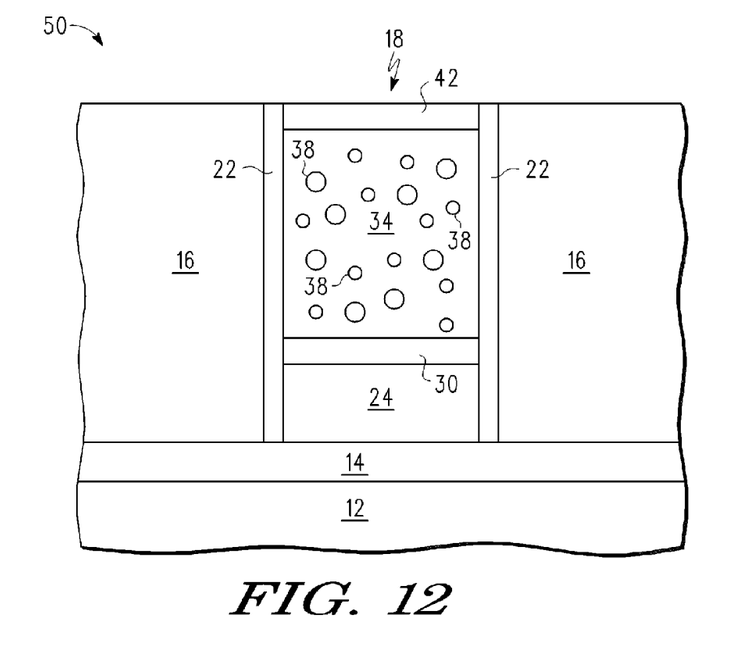
FIG. 12 is a cross-sectional view of a conductive bridge random access memory (CBRAM) bitcell according to another embodiment of the present disclosure.

FIG. 12 is a cross-sectional view of a conductive bridge random access memory (CBRAM) bitcell according to another embodiment of the present disclosure. The CBRAM bitcell 50 of FIG. 12 is similar to the CBRAM bitcell 10 of FIG. 11, with the following differences. In bitcell 50, the active bottom electrode comprises a single metal, for example, copper, instead of an upper metal Ag and a lower metal Cu. The bitcell 50 also include barrier layer 30. In addition, clusters 38 are formed of Cu, wherein the Cu is diffused into the bridgeable material 34, for example, utilizing a suitable treatment as discussed herein above with respect to FIG. 9 and the diffusion of Ag within bridgeable material 34.

Figure 13:
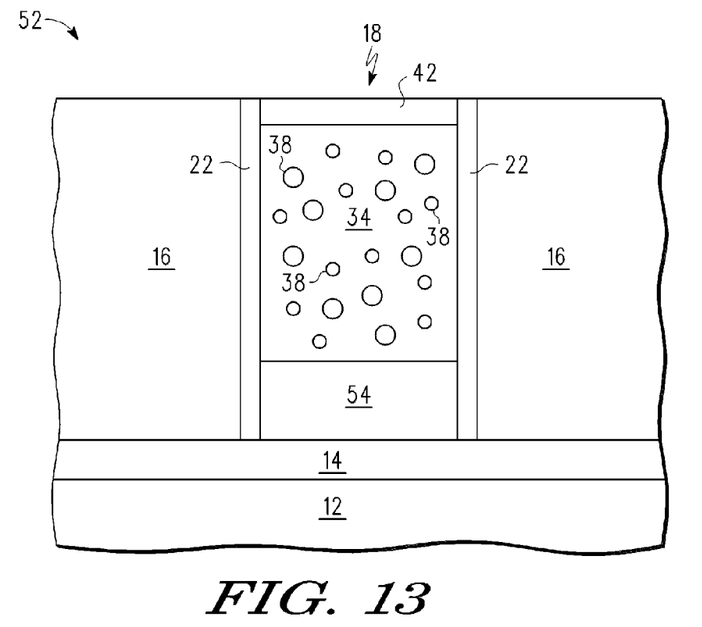
FIG. 13 is a cross-sectional view of a conductive bridge random access memory (CBRAM) bitcell according to a further embodiment of the present disclosure.

FIG. 13 is a cross-sectional view of a conductive bridge random access memory (CBRAM) bitcell 52 according to a further embodiment of the present disclosure. The CBRAM bitcell 52 of FIG. 13 is similar to the CBRAM bitcell 10 of FIG. 11, with the following differences. In bitcell 52, the active bottom electrode comprises a single metal, for example, copper or silver, instead of an upper metal and a lower metal. In addition, bitcell 52 does not include a barrier layer between the bottom electrode 54 and the bridgeable material 34. In addition, the clusters 38 are formed of Cu or Ag, wherein the Cu or Ag is diffused into the bridgeable material 34, for example, utilizing a suitable treatment as discussed herein above with respect to FIG. 9 and the diffusion of Ag within bridgeable material 34.

Figure 14:
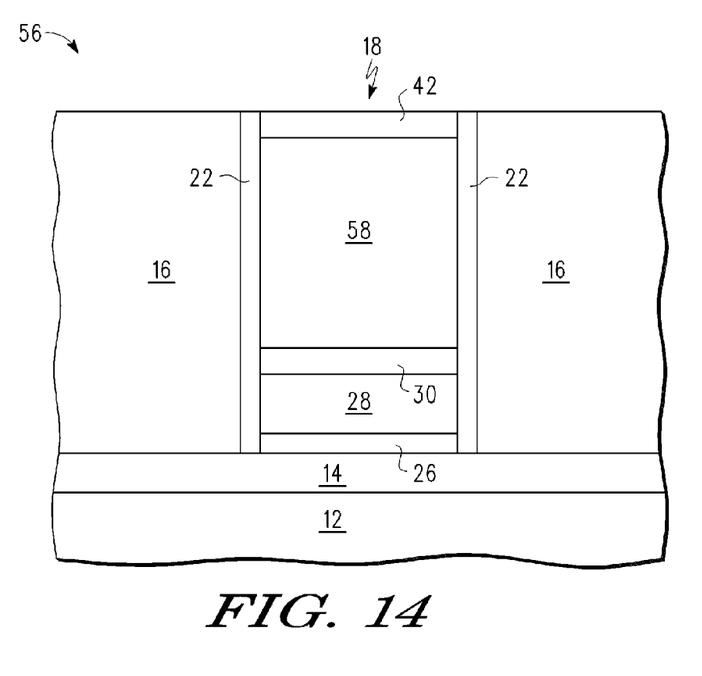
FIG. 14 is a cross-sectional view of a conductive bridge random access memory (CBRAM) bitcell according to yet another embodiment of the present disclosure.

FIG. 14 is a cross-sectional view of a conductive bridge random access memory (CBRAM) bitcell 56 according to yet another embodiment of the present disclosure. The CBRAM bitcell 56 of FIG. 14 is similar to the CBRAM bitcell 10 of FIG. 11, with the following differences. In bitcell 56, the conductive bridgeable material 58 comprises a deposited oxide wherein the deposited oxide is conducive to forming a conductive pathway with ions from the active bottom electrode. In addition, the active bottom electrode comprises an upper metal 28 of Ag and a lower metal 26 of Cu. The bitcell 56 also include barrier layer 30 located between the active bottom electrode and the conductive bridgeable material. Furthermore, the bridgeable material 58 is devoid of any clusters.

Figure 15:
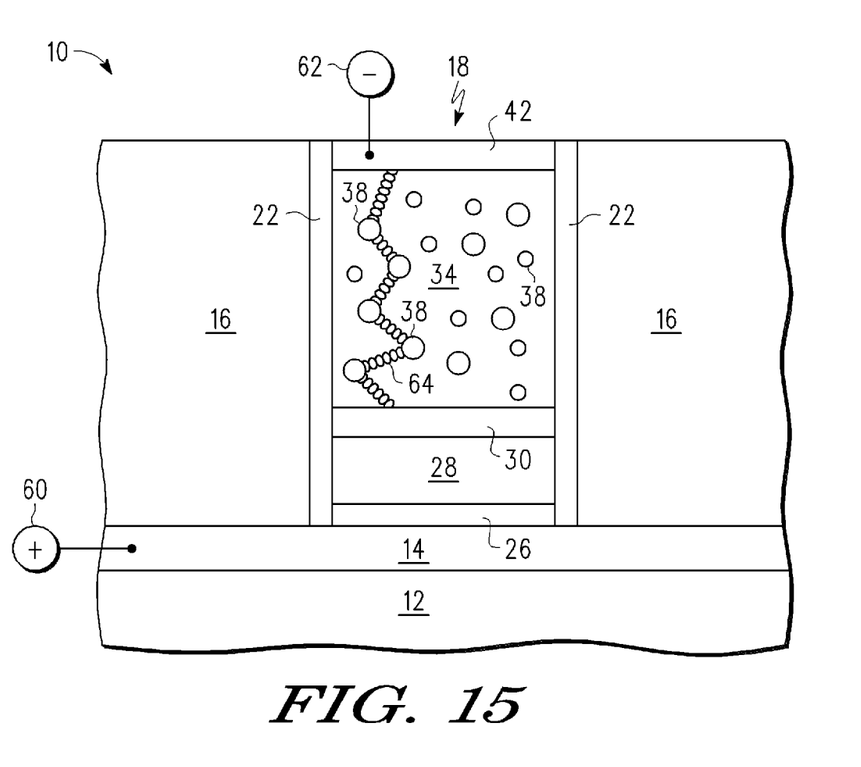
FIG. 15 is a cross-sectional view of the conductive bridge random access memory (CBRAM) bitcell of FIG. 11 in which a voltage potential applied across the electrodes produces a conductive bridge between the electrodes.

FIG. 15 is a cross-sectional view of the conductive bridge random access memory (CBRAM) bitcell 10 of FIG. 11 in which a voltage potential applied across the electrodes produces a conductive bridge between the electrodes. In one embodiment, a positive voltage potential 60 is applied to active electrode (26,28) via interconnect metallization line 14 and a negative voltage potential 62 is applied to inert or non-active electrode 42 via any suitable connection. Upon application of appropriate potential difference across the bitcell 10, ions from active electrode (26,28) migrate into the bridgeable material 34 and forms one or more conductive bridge 64 between the active electrode (26,28) and the non-active electrode (42). Although only one conductive bridge 64 is illustrated, more than one conductive bridge may be formed. When the potential is removed, the state of the chain remains. When the potential is reversed from that as shown in the FIG. 15, the chain breaks down and becomes non-conductive between the active electrode and the non-active electrode across the bridgeable material. In the later instance, the state of the broken chain will be maintained until such time as the positive voltage potential 60 and negative voltage potential 62 are applied as shown in FIG. 15 to form the one or more conductive bridge 64. Note that while FIG. 15 illustrates one example of voltage potential (+) and (−) as applied across the bitcell 10, in another embodiment, the polarities could be reversed for forming the one or more conductive bridge 64.

By now it should be appreciated that there has been provided a method for making a semiconductor device that includes providing an interconnect layer over an underlying layer, forming a first insulating layer over the interconnect layer, and forming an opening through the insulating layer to the interconnect layer. The method further includes forming a first conductive layer over the interconnect layer and in the opening by plating, forming a second conductive layer in the opening by displacement by immersion, wherein the second conductive layer is formed after the first conductive layer. In addition the second conductive layer comprises bridging material. The method further includes forming a layer of bridgeable material over the second conductive layer and in the opening, and forming a third conductive layer over the bridgeable material. The method further comprises applying energy to the second conductive layer for forming clusters of bridging material in the layer of bridgeable material, wherein the clusters comprise bridging material from the second conductive layer.

In another embodiment, the method further comprises applying a voltage between the interconnect layer and the third conductive layer to form a bridge of bridging material between the second layer and the third conductive layer, wherein the clusters are connected by bridging material. The step of forming the second conductive layer is further characterized by the displacement by immersion causing replacement of a top portion of the first conductive layer with bridging material. The step of forming the second conductive layer is further characterized by bridging material comprising silver. The step of forming the first conductive layer is further characterized by the first conductive layer comprising copper. In one embodiment, the step of forming the bridgeable material is further characterized by the bridgeable material comprising a chalcogenide. In another embodiment, the step of forming the bridgeable material is further characterized by the bridgeable material comprising an oxide.

In another embodiment, the method further comprises forming a second insulating layer over the first insulating layer and in the opening, wherein the second insulating layer is conformal, wherein the forming the second insulating layer is performed before forming the first conductive layer and the second insulating layer is of a different type of material from the first insulating layer. The method further includes anisotropically etching the second insulating layer to result in a sidewall spacer along a sidewall of the opening.

According to yet another embodiment, the method further comprises forming a barrier layer over the second conductive layer prior to the forming the layer of bridgeable material. The step of forming the barrier layer is further characterized by the barrier layer comprising one of group consisting of cobalt and nickel, one of a group consisting of tungsten, molybdenum, and rhenium, and one of a group consisting of boron and phosphorus.

In another embodiment, a method of forming a semiconductor device comprises providing an interconnect layer over an underlying layer, forming a first insulating layer over the interconnect layer, and forming an opening through the insulating layer to the interconnect layer. The method further includes forming a first conductive layer over the interconnect layer and in the opening by selective deposition, wherein the first conductive layer comprises bridging material, forming a layer of bridgeable material over the first conductive layer and in the opening, and forming a second conductive layer over the bridgeable material. The step of forming the first conductive layer is further characterized by the first conductive layer comprising copper. In one embodiment, the step of forming the layer of bridgeable material is further characterized by the layer of bridgeable material being a chalcogenide. In another embodiment, the step of forming the layer of bridgeable material is further characterized by the layer of bridgeable material being an oxide.

In a further embodiment, the method comprises forming a second insulating layer over the first insulating layer and in the opening, wherein the second insulating layer is conformal, wherein the forming the second insulating layer is performed before forming the first conductive layer and the second insulating layer is of a different type of material from the first insulating layer. The method further includes anisotropically etching the second insulating layer to result in a sidewall spacer along a sidewall of the opening. In yet another embodiment, the method further comprises forming a barrier layer over the first conductive layer prior to the forming the layer of bridgeable material.

In yet another embodiment, a semiconductor memory device comprises: an interconnect layer over an underlying layer; a first insulating layer over the interconnect layer; an opening in the insulating layer to the interconnect layer; a first conductive layer over the interconnect layer and in the opening, wherein the first conductive layer comprises a bridging material; a layer of bridgeable material over the first conductive layer and in the opening; and a second conductive layer over the bridgeable material. The semiconductor memory device further comprises a first barrier along a sidewall of the opening, wherein the barrier is characterized as being an insulator and functions as a diffusion barrier between the first insulating layer and the first conductive layer. The semiconductor memory device further comprises a second barrier between the first conductive layer and the layer of bridgeable material, wherein: the second barrier allows transfer of material between the first conductive layer and the layer of bridgeable material during programming and erasing of the semiconductor memory device; and the second barrier blocks transfer of material between the first conductive layer and the layer of bridgeable material during reading of the semiconductor memory device.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the embodiments of the present disclosure can also be applied to other memory devices, for example, MRAM, embedded memory, embedded NVM, embedded SRAM, etc. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for making a semiconductor device, comprising:
   providing an interconnect layer over an underlying layer;
   forming a first insulating layer over the interconnect layer;
   forming an opening through the insulating layer to the interconnect layer;
   forming a first conductive layer over the interconnect layer and in the opening by plating;
   forming a second conductive layer in the opening by immersion, wherein:
      the second conductive layer is formed after the first conductive layer;
      during immersion, the second conductive layer displaces a portion of the first conductive layer; and
      the second conductive layer comprises bridging material;
   forming a barrier layer over the second conductive layer;
   forming a layer of bridgeable material over the barrier layer; and
   forming a third conductive layer over the bridgeable material.

2. The method of claim 1 further comprising applying energy to the second conductive layer for forming clusters of bridging material in the layer of bridgeable material, wherein the clusters comprise bridging material from the second conductive layer.

3. The method of claim 1 further comprising applying a voltage between the interconnect layer and the third conductive layer to form a bridge of bridging material between the second conductive layer and the third conductive layer, wherein the clusters are connected by bridging material.

4. The method of claim 2, wherein the step of forming the second conductive layer causes a replacement of a top portion of the first conductive layer.

5. The method of claim 4, wherein the step of forming the second conductive layer is further characterized by bridging material comprising silver.

6. The method of claim 5, wherein the step of forming the first conductive layer is further characterized by the first conductive layer comprising copper.

7. The method of claim 5, wherein the step of forming the bridgeable material is further characterized by the bridgeable material comprising a chalcogenide.

8. The method of claim 5, wherein the step of forming the bridgeable material is further characterized by the bridgeable material comprising an oxide.

9. The method of claim 1, further comprising:
   forming a second insulating layer over the first insulating layer and in the opening, wherein the second insulating layer is conformal, wherein the forming the second insulating layer is performed before forming the first conductive layer and the second insulating layer is of a different type of material from the first insulating layer; and
   anisotropically etching the second insulating layer to result in a sidewall spacer along a sidewall of the opening.

10. The method of claim 1, further comprising forming another barrier along a sidewall of the opening before forming the first conductive layer.

11. The method of claim 1, wherein the barrier layer comprises one of a group consisting of cobalt and nickel, one of a group consisting of tungsten, molybdenum, and rhenium, and one of a group consisting of boron and phosphorus.

12. A method of forming a semiconductor device, comprising:
   providing an interconnect layer over an underlying layer;
   forming a first insulating layer over the interconnect layer;
   forming an opening through the insulating layer to the interconnect layer;
   forming a first conductive layer over the interconnect layer and in the opening by selective deposition, wherein the first conductive layer comprises bridging material;
   forming a barrier layer over the first conductive layer;
   forming a layer of bridgeable material over barrier layer; and
   forming a second conductive layer over the bridgeable material.

13. The method of claim 12, wherein the step of forming the first conductive layer is further characterized by the first conductive layer comprising copper.

14. The method of claim 12, wherein the step of forming the layer of bridgeable material is further characterized by the layer of bridgeable material being a chalcogenide.

15. The method of claim 12, wherein the step of forming the layer of bridgeable material is further characterized by the layer of bridgeable material being an oxide.

16. The method of claim 12, further comprising:
forming a second insulating layer over the first insulating layer and in the opening, wherein the second insulating layer is conformal, wherein the forming the second insulating layer is performed before forming the first conductive layer and the second insulating layer is of a different type of material from the first insulating layer; and
anisotropically etching the second insulating layer to result in a sidewall spacer along a sidewall of the opening.

17. The method of claim 12 wherein the barrier layer comprises one of a group consisting of cobalt and nickel, one of a group consisting of tungsten, molybdenum, and rhenium, and one of a group consisting of boron and phosphorus.

18. A semiconductor memory device, comprising:
an interconnect layer over an underlying layer;
a first insulating layer over the interconnect layer;
an opening in the insulating layer to the interconnect layer;
a first conductive layer over the interconnect layer and in the opening, wherein the first conductive layer comprises a bridging material;
a first barrier over the first conductive layer;
a layer of bridgeable material over the first barrier; and
a second conductive layer over the bridgeable material.

19. The semiconductor memory device of claim 18, further comprising a second barrier along a sidewall of the opening, wherein the second barrier is characterized as being an insulator and functions as a diffusion barrier between the first insulating layer and the first conductive layer.

20. The semiconductor memory device of claim 19, wherein:
the second barrier allows transfer of material between the first conductive layer and the layer of bridgeable material during programming and erasing of the semiconductor memory device; and
the second barrier blocks transfer of material between the first conductive layer and the layer of bridgeable material during reading of the semiconductor memory device.

\* \* \* \* \*